(12) United States Patent
Boerstler

(10) Patent No.: US 7,162,001 B2
(45) Date of Patent: Jan. 9, 2007

(54) CHARGE PUMP WITH TRANSIENT CURRENT CORRECTION

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 873 days.

(21) Appl. No.: 10/268,258

(22) Filed: Oct. 10, 2002

(65) Prior Publication Data

US 2004/0071252 A1   Apr. 15, 2004

(51) Int. Cl.
*H03D 3/24* (2006.01)

(52) U.S. Cl. .................... 375/374; 327/150

(58) Field of Classification Search ............ 331/17, 331/57; 327/157, 150, 151
See application file for complete search history.

(56) References Cited

U.S. PATENT DOCUMENTS

| | | | |
|---|---|---|---|
| 5,285,114 A | | 2/1994 | Atriss et al. |
| 5,428,837 A | * | 6/1995 | Bayruns et al. ............ 455/317 |
| 5,508,660 A | * | 4/1996 | Gersbach et al. ............ 331/17 |
| 5,886,551 A | | 3/1999 | Narahara |
| 5,945,855 A | * | 8/1999 | Momtaz .................... 327/157 |
| 5,949,264 A | * | 9/1999 | Lo ............................. 327/157 |
| 5,952,892 A | * | 9/1999 | Szajda ........................ 331/57 |
| 6,163,187 A | | 12/2000 | Sano |
| 6,222,402 B1 | * | 4/2001 | Boerstler et al. ........... 327/157 |
| 6,316,977 B1 | * | 11/2001 | Sargeant ..................... 327/157 |
| 6,326,852 B1 | * | 12/2001 | Wakayama .................. 331/17 |
| 6,329,872 B1 | | 12/2001 | Foroudi |

OTHER PUBLICATIONS

Alvarez, J. et al.; "A Wide-Bandwidth Low-Voltage PLL for PowerPC Microprocessors"; *IEEE JCCS*; Apr. 1995; vol. SC-30; pp. 383-391.

* cited by examiner

*Primary Examiner*—Tesfaldet Bocure
*Assistant Examiner*—Sudhanshu C. Pathak
(74) *Attorney, Agent, or Firm*—Carr LLP; Diana R. Gerhardt

(57) ABSTRACT

An improved charge pump used in a phase-locked loop includes transient current correction capability by adding a canceling capacitance for each parasitic capacitance associated with a switching device in a charge pump. For each transient current component flowing through the parasitic capacitance, a canceling capacitance is implemented to create a canceling transient current component in the opposite direction such that it cancels out the transient current component. Preferably, an additional switching device is added to implement such a canceling capacitance for each parasitic capacitance.

20 Claims, 4 Drawing Sheets

CHARGE PUMP WITH TRANSIENT CURRENT CORRECTION

BACKGROUND OF THE INVENTION

1. Field of the Invention

The invention relates generally to a phase-locked loop (PLL) and, more particularly, to an improved charge pump with transient current correction.

2. Description of the Related Art

High-performance, low-jitter phase-locked loops (PLLs) require accurate sensing and correction of the phase and frequency error between a reference clock signal and a feedback clock signal. Typically, a PLL includes a phase-frequency detector (PFD), a charge pump, a loop filter, a voltage-controlled oscillator (VCO), and optionally a frequency divider. The PFD senses the aforementioned phase and frequency error and generates timing signals, which are used to generate currents in the charge pump. These currents are then integrated by a loop filter to create a control voltage, which is input to the VCO. This voltage controls the frequency of the VCO. Ideally, a plot of this control voltage as a function of a phase error should produce a linear response over the cycle and should pass through the origin of the plot. For conventional charge pumps currently used in PLLS, however, this is not the case.

Conventional charge pumps have current source and sink along with switching devices used to control current flows through the current source and sink. The output signals of a PFD switch these switching devices. Typically, when the feedback clock signal leads the reference clock signal, the current sink is coupled to the loop filter so that the control voltage is decreased. When the reference clock signal leads the feedback clock signal, the current source is coupled to the loop filter so that the control voltage is increased. When the PLL is locked, nether the current source nor the current sink is coupled to the loop filter so that the control voltage does not change.

The switching devices are coupled to the current source and sink in series. The devices may be positioned either at the top and bottom of the current source and sink or between the stack of the current source and sink. In such structures, the switching devices force the current in the current sources or sinks to be shut off, resulting in large biasing differences between conducting and non-conducting states. The current source and sink are typically implemented with current mirrors. The current mirrors generally comprise a plurality of transistors such as metal-oxide-silicon field effect transistors (MOSFETs). These three-terminal transistors have parasitic capacitances between a gate and the other two terminals (drain and source terminals in case of MOSFETs). These parasitic capacitances contribute additional transient currents, which distort the linearity of the control voltage as a function of a phase error when the phase error is small. For small phase errors, the initial transient current dominates the charge pump's response. In the aforementioned plot of the control voltage as a function of a phase error, therefore, a conventional charge pump would generate a higher slope region at or near the origin where the transient currents flow and a discontinuity in the response after the transient currents have died out. There is also another discontinuity at the origin of the transfer function because the transient currents are different for charge and discharge operations. These transient currents are not well controlled since they are due to the design and process of the switching devices.

Therefore, there is a need for an improved charge pump that eliminates these transient currents associated with the switching devices used in the charge pump.

SUMMARY OF THE INVENTION

The present invention provides a charge pump with transient current correction. The charge pump is coupled to a loop filter to charge and discharge the loop filter in a phase-locked loop.

At least a switching device is included in the charge pump for receiving a control signal. The switching device has at least a parasitic capacitance such that a transient current component is created across the parasitic capacitance while the control signal is in a transient state. At least a canceling capacitance is also included in the charge pump and is coupled to the parasitic capacitance for receiving an inverted signal of the control signal such that a canceling transient current component is created across the canceling capacitance while the control signal in a transient state. This canceling transient current component effectively cancels out the transient current component.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Figure 1:
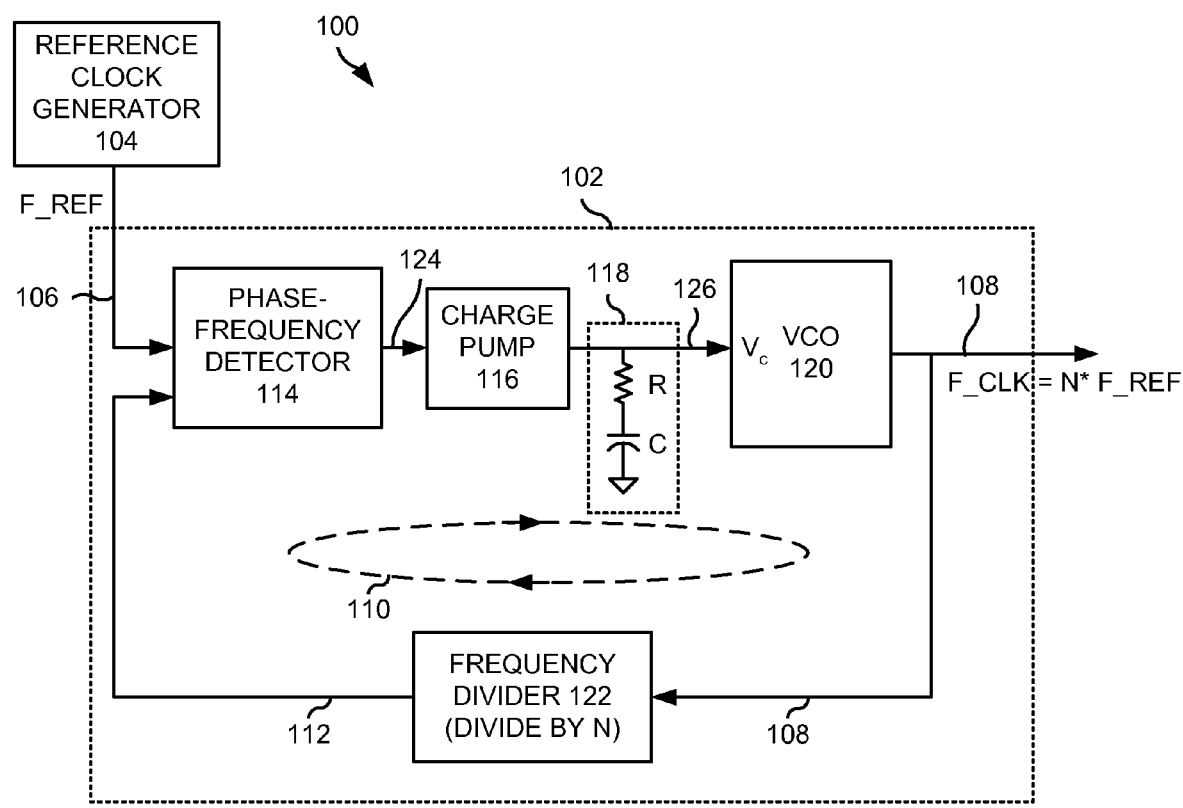
FIG. 1 is a block diagram of a phase-locked loop.

Referring to FIG. 1 of the drawings, the reference numeral 100 generally designates a block diagram incorporating a phase-locked loop (PLL) 102. The PLL 102 is coupled to a reference clock generator 104 to receive a reference clock signal 106 having frequency F_REF and is configured to generate a PLL output signal 108 having frequency F_CLK. Generally, the PLL 102 uses a feedback loop 110 to lock a feedback signal 112 to the reference clock signal 106.

Specifically, the feedback loop 110 includes a phase-frequency detector 114, a charge pump 116, a loop filter 118, a voltage-controlled oscillator (VCO) 120, and optionally a frequency divider 122.

In the PLL 102, the phase-frequency detector 114 compares the reference clock signal 106 and the feedback signal 112 and generates an error signal 124, which is proportional to the magnitude of the phase/frequency difference between the reference clock signal 106 and the feedback signal 112.

The error signal 124 is fed to the charge pump 116. Typically, the error signal 124 has three states: UP, DN, and OFF. UP is asserted when the reference clock signal 106 lags behind the feedback signal 112, whereas DN is asserted when the reference clock signal 112 leads the feedback signal 112. When the PLL 102 is locked, neither UP nor DN is asserted, which is an OFF state. The charge pump 116 controls the magnitude of charge stored in the loop filter 118 using current, thereby converting the error signal 124 into a control voltage input $V_c$ 126, which is recognizable by the VCO 120. For example, the loop filter 118 contains a series RC combination. The series RC combination produces a second order system. However, other types of loop filters may be used instead. The VCO 120 generates the PLL output signal 108. Typically, the frequency F_CLK of the PLL output signal 108 is proportional to the control voltage input 126.

Optionally, the frequency divider 122 further divides down the frequency F_CLK of the PLL output signal 108 before the PLL output signal 108 is fed back to the phase-frequency detector 122. Provided that the frequency divider 122 is used in the PLL 102, the frequency of the PLL output signal 108 is higher than that of the feedback signal 112 by a factor of the frequency divider 122. For example, if the frequency divider 122 with a factor of N is used, the frequency of the PLL output signal 108 is approximately N times that of the feedback signal 112. Therefore, F_CLK=N*F_REF, wherein N is a positive integer. This is because the PLL 102 locks the frequency of the feedback signal 112 to the frequency F_REF of the reference clock signal 106 in the feedback loop 110.

Figure 2:
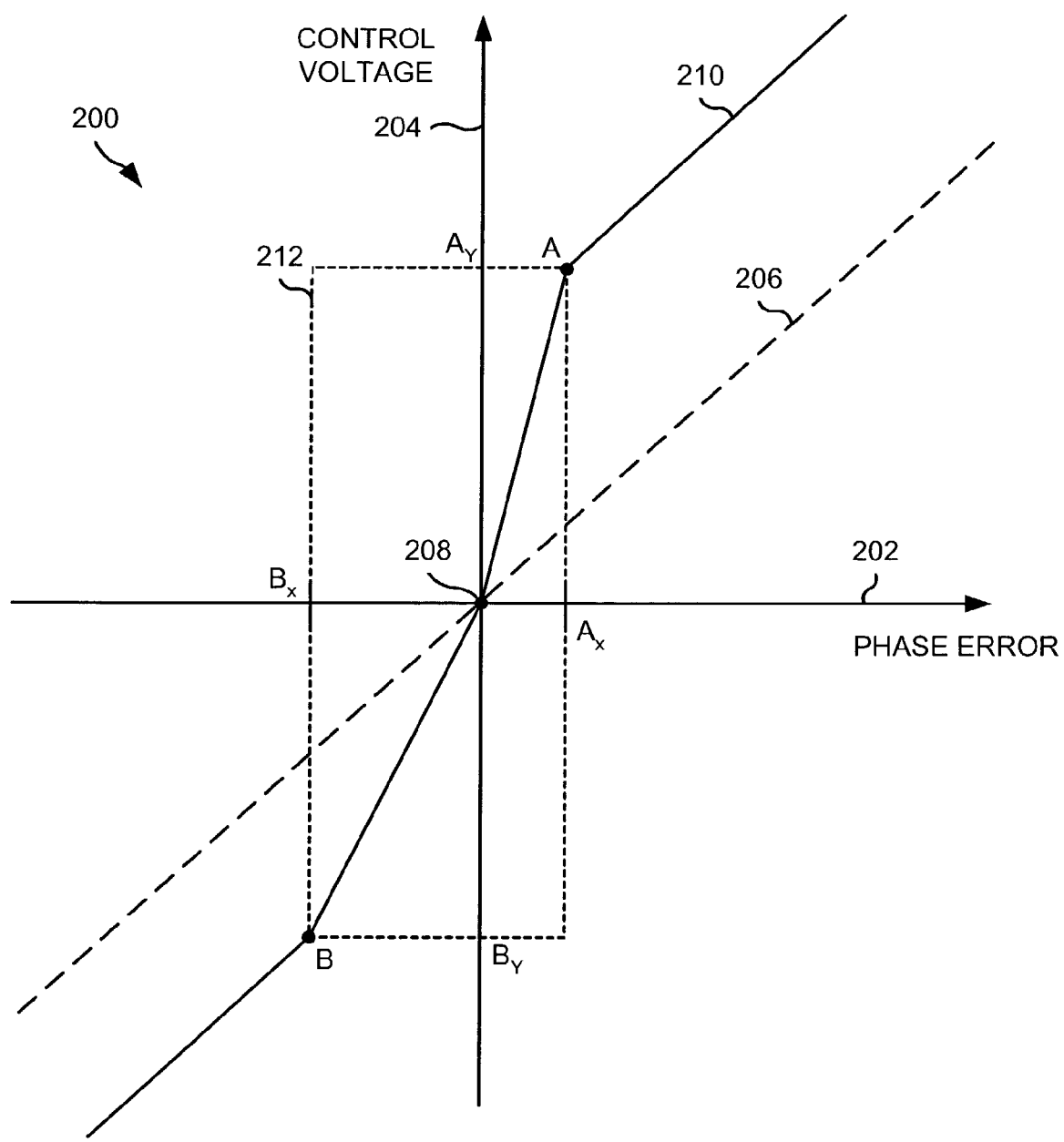
FIG. 2 is a plot diagram of a two-dimensional Cartesian coordinate system depicting a plot of a control voltage of a loop filter as a function of a phase error detected by a phase-frequency detector in a phase-locked loop constructed in a accordance with the principles of the present invention.

Now referring to FIG. 2, a plot diagram 200 of a two-dimensional Cartesian coordinate system is shown to depict a plot of a control voltage of a loop filter as a function of a phase error detected by a phase-frequency detector in a phase-locked loop. The plot diagram 200 has the phase error and the control voltage as an x (horizontal) axis 202 and y (vertical) axis 204, respectively. Ideally, the plot diagram 200 should produce a linear response as shown in a dashed line 206 and should pass through the origin 208. As shown in a solid line 210, a conventional charge pump would generate a higher slope region 212 at or near the origin 208, where the transient currents flow, and discontinuities around points A and B in the response after the transient currents have died out. There is also another discontinuity at the origin of the transfer function because the transient currents are different for charge and discharge operations. In the plot diagram 200, it is assumed for simplicity that the transient currents exist, wherein the phase error is within the region 212, and do not exist at all, wherein the phase error is outside the region 212.

Figure 3:
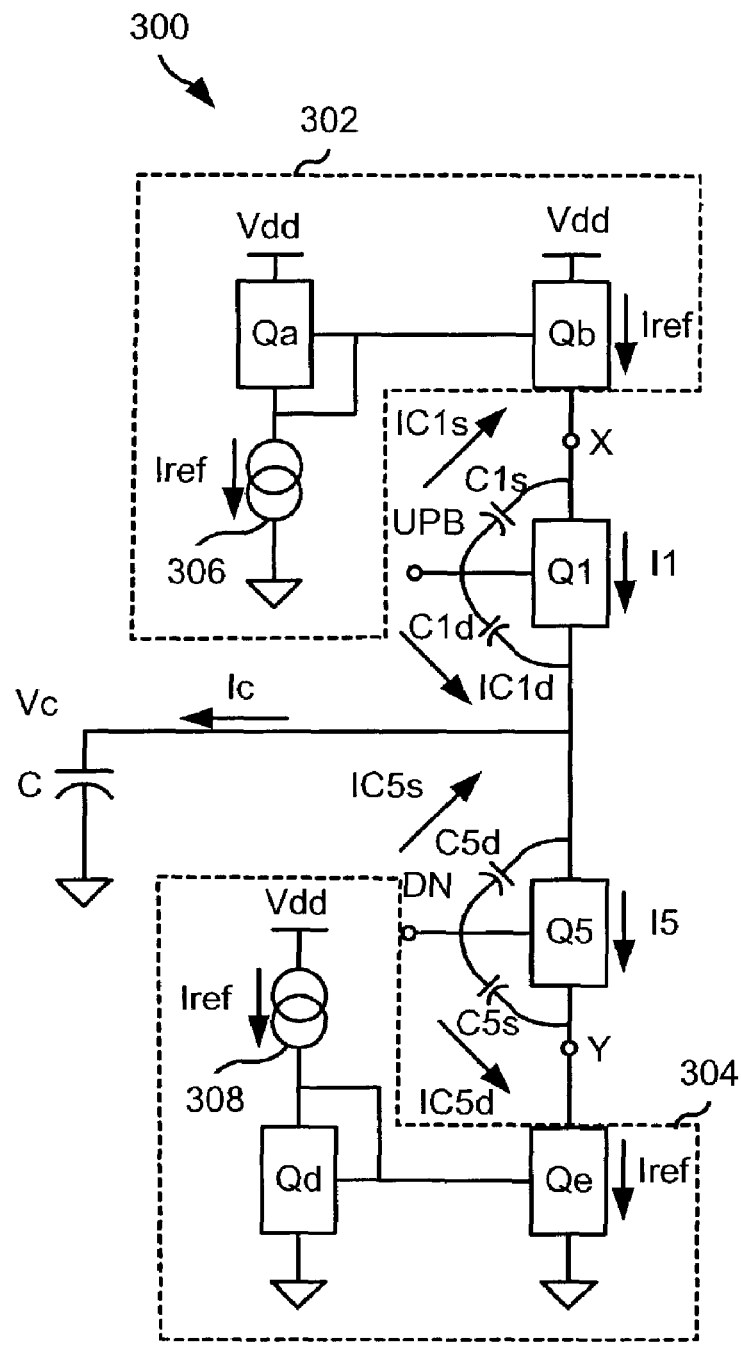
FIG. 3 is a schematic diagram depicting a prior-art charge pump circuit.

In FIG. 3, a schematic diagram of a prior-art charge pump circuit 300 is shown. The prior-art charge pump circuit 300 comprises a source current mirror 302, a sink current mirror 304, and switching devices Q1 and Q5. Switching device Q1 is coupled between the source current mirror 302 and a capacitor C. Similarly, switching device Q5 is coupled between the sink current mirror 304 and the capacitor C. Switching device Q1 has parasitic capacitances C1s and C1d. Similarly, switching device Q5 has parasitic capacitances C5s and C5d. Note that switching devices Q1 and Q5 are controlled by UPB and DN, respectively. UPB is an inverted signal of UP signal. As mentioned above in reference to FIG. 1, UP and DN signals are generated by the phase-frequency detector 114.

Preferably, the source current mirror 302 comprises a reference current source 306 coupled to biasing device Qa, which is coupled to biasing device Qb. The reference current source 306 is configured for flow reference current Iref. Note that biasing device Qa has its two terminals (e.g., gate and drain terminals in case that switching device Qa is a p-channel MOSFET) coupled together at node A. Since the control terminal of the biasing device Qb is also coupled to node A, the potential of the control terminals of biasing devices Qa and Qb are equal. This along with other bias conditions allows switching device Qb to flow reference current Iref through switching device Qb when switching device Q1 is turned on.

Similarly, the sink current mirror 304 comprises a reference current source 308 coupled to biasing device Qd, which is coupled to biasing device Qe. The reference current source 308 is configured for flow reference current Iref. Note that biasing device Qd has its two terminals (e.g., gate and drain terminals in case that switching device Qd is a n-channel MOSFET) coupled together at node B. Since the control terminal of the biasing device Qe is also coupled to node B, the potential of the control terminals of biasing devices Qd and Qe are equal. This along with other bias conditions allows switching device Qe to flow reference current Iref through switching device Qe when switching device Q5 is turned on.

Node X will rise to the level of Vdd when UPB is high (i.e., UP is not asserted). When UPB is low (i.e., UP is asserted), the initial current in device Q1 is usually much larger than the desired current Iref supplied through Qb, because the voltage drop (Vsg) between node X and the control terminal of Q1 approximately equals Vdd. Parasitic capacitances C1s, C1d, C5s, and C5d contribute additional transient currents to currents I1 an Ic. Similarly, assertions on DN create current transients by the same mechanisms as UPB, but of different magnitude due to difference in device characteristics and parasitics between switching devices Q1 and Q5. Preferably, devices Qa, Qb, and Q1 are PMOS transistors, whereas devices Qd, Qe, and Q5 are NMOS transistors.

Figure 4:
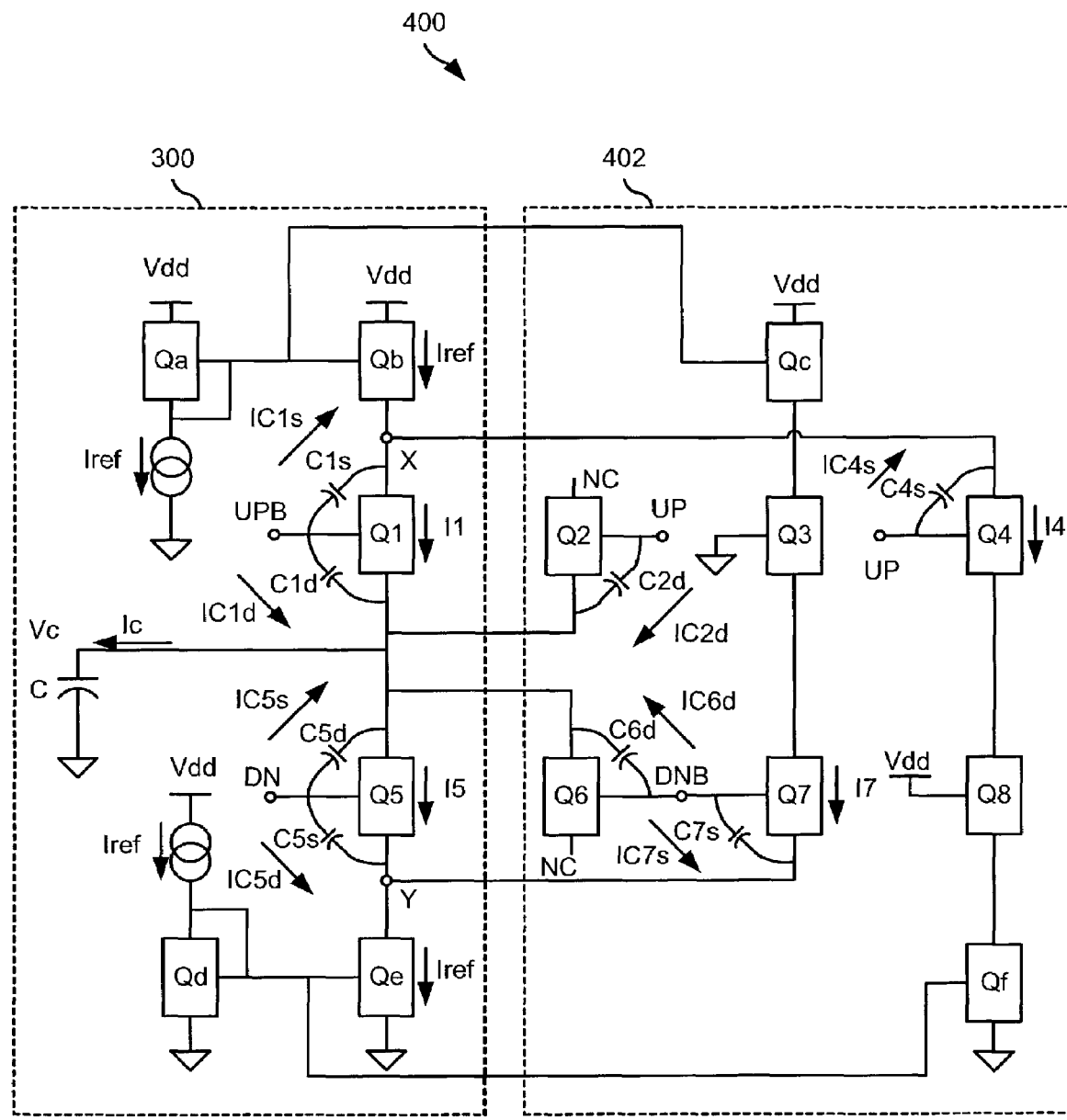
FIG. 4 is a schematic diagram depicting an improved charge pump circuit with transient current correction.

FIG. 4 is a schematic diagram depicting an improved charge pump circuit 400 with transient current correction. The improved charge pump circuit 400 includes the prior-art charge pump circuit 300 and a transient current correction circuit 402 interconnected to the prior-art charge pump circuit 300.

The transient current correction circuit 402 comprises devices Qc, Qf, Q2, Q3, Q4, Q6, Q7, and Q8. Devices Qb and Qc are identical and are matched to Qa. Similarly, devices Qe and Qf are identical and are matched to Qd. Signals UP and UPB are complementary as are signals DN/DNB. These complementary signal pairs are matched such that they switch simultaneously but UPB and DN are never asserted simultaneously. As UPB transitions from low to high (or high to low) and UP switches simultaneously from high to low (low to high), parasitic transient currents IC1s, IC1d, and IC4s will flow. If devices Q1, Q2, and Q4 are identical in size (e.g., W and L), type, and orientation, etc. and are in close proximity, then IC1s=−IC4s, and IC1d=−IC2d, effectively canceling each other since UP and UPB switch in opposite directions simultaneously. Devices Q4, Q8, and Qf form a complementary current path to the path formed by Q1, Q5, and Qe. Since current Iref produced by current source Qb will flow regardless of the state of UP/UPB, node X will remain constant, removing the greatest source of unwanted transient current from I1.

Similarly, if devices Q5, Q6, and Q7 are identical in size (e.g., W and L), type, and orientation, etc. and are in close proximity, then IC5d=−IC6d, and IC5s=−IC7s, effectively canceling each other since DN and DNB switch in opposite directions simultaneously. Devices Q3 and Q8 allow more even match between the complementary paths and the main current paths, which charge and discharge capacitor C, and are identical to Q1 and Q5, respectively.

Preferably, devices Qa, Qb, Qc, Q1, Q2, Q3, and Q4 are PMOS transistors, whereas devices Q5, Q6, Q7, Q8, Qd, Qe, and Qf are NMOS transistors. However, different types of transistors may be used instead without departing from the true spirit of the present invention.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

The invention claimed is:

1. A charge pump coupled to a loop filter to charge and discharge the loop filter in a phase-locked loop, the charge pump comprising:
a first switching device configured for receiving a first control signal, the first switching device having at least a first parasitic capacitance such that a first transient current component is created across the first parasitic capacitance while the first control signal is in a transient state; and
a first canceling capacitance coupled to the first parasitic capacitance and configured for receiving an inverted signal of the first control signal such that a first canceling transient current component is created across the first canceling capacitance while the first control signal in a transient state, thereby effectively canceling out the first transient current component.

2. The charge pump of claim 1, further comprising:
a second switching device configured for receiving a second control signal, the second switching device having at least a second parasitic capacitance such that a second transient current component is created across the second parasitic capacitance while the second control signal is in a transient state; and
a second canceling capacitance coupled to the second parasitic capacitance and configured for receiving an inverted signal of the second control signal such that a second canceling, transient current component is created across the second canceling capacitance while the second control signal is in a transient state, thereby effectively canceling out the second transient current component.

3. The charge pump of claim 1, wherein the first switching device has at least a second parasitic capacitance such that a second transient current component is created across the second parasitic capacitance while the first control signal is in a transient state, the charge pump further comprising a second canceling capacitance coupled to the second parasitic capacitance and configured for receiving an inverted signal of the first control signal such that a second canceling transient current component is created across the second canceling capacitance while the first control signal is in a transient state, thereby effectively canceling out the second transient current component.

4. The charge pump of claim 2, wherein the first switching device has at least a third parasitic capacitance such that a third parasitic capacitance such that a third transient current component is created across the third parasitic capacitance while the first control signal is in a transient state, the charge pump farther comprising a third canceling capacitance coupled to the third parasitic capacitance and configured for receiving an inverted signal of the first control signal such that a third canceling transient current component is created across the third canceling capacitance while the first control signal is in a transient state, thereby effectively canceling out the third transient current component.

5. The charge pump of claim 4, wherein the second switching device has at least a fourth parasitic capacitance such that a fourth transient current component is created across the fourth parasitic capacitance while the second control signal is in a transient state, the charge pump further comprising a fourth canceling capacitance coupled to the fourth parasitic capacitance and configured for receiving an inverted signal of the second control signal such that a fourth canceling transient current component is created across the fourth canceling capacitance while the second control signal is in a transient state, thereby effectively canceling out the fourth transient current component.

6. The charge pump of claim 1, wherein the first switching device is a MOS transistor, the MOS transistor having a gate, drain, and source terminal, and wherein the first control signal is applied to the gate terminal.

7. The charge pump of claim 1, wherein the first switching device is configured to charge the loop filter when the first switching device is turned on.

8. The charge pump of claim 7, wherein the first switching device is a first PMOS transistor, the first PMOS transistor having a gate, drain, and source terminal, and wherein the first control signal is applied to the gate terminal of the first PMOS transistor to turn on the first PMOS transistor when the first control signal is in a low state.

9. The charge pump of claim 8, wherein the first parasitic capacitance is formed between the gate and source terminals of the first PMOS transistor.

10. The charge pump of claim 9, further comprising a second PMOS transistor having a gate, drain, and source terminal, the inverted signal of the first control signal being applied to the gate terminal of the second PMOS transistor, the first canceling capacitance being formed between the gate and source terminals of the second PMOS transistor, wherein the source terminals of the first and second PMOS transistors are connected together.

11. The charge pump of claim 2, wherein the second switching device is configured to discharge the loop filter when the second switching device is turned on.

12. The charge pump of claim 11, wherein the first and second switching devices are a first PMOS and NMOS transistor, respectively, the first PMOS and NMOS transistor each having a gate, drain, and source terminal, and wherein the first and second control signals are applied to the gate terminals of the first PMOS and NMOS transistors, respectively.

13. The charge pump of claim 12, wherein the first parasitic capacitance is formed between the gate and source terminals of the first PMOS transistor, and wherein the second parasitic capacitance is formed between the gate and drain terminals of the first NMOS transistor.

14. The charge pump of claim 13, further comprising a second NMOS transistor having a gate, drain, and source terminal, the inverted signal of the second control signal being applied to the gate terminal of the second NMOS transistor, the second canceling capacitance being formed between the gate and the drain terminals of the second NMOS transistor, wherein the drain terminals of the first and second PMOS transistors are connected together.

15. The charge pump of claim 3, wherein the first switching device is configured to charge the loop filter when the first switching device is turned on.

16. The charge pump of claim 15, wherein the first switching device is a first PMOS transistor, the first PMOS transistor having a gate, drain, and source terminal, and wherein the first control signal is applied to the gate terminal of the first PMOS transistor to turn on the first PMOS transistor when the first control signal is in a low state.

17. The charge pump of claim 16, wherein the first parasitic capacitance is formed between the gate and source terminals of the first PMOS transistor, and wherein the second parasitic capacitance is formed between the gate and drain terminals of the first PMOS transistor.

18. The charge pump of claim 17, further comprising a second PMOS transistor having a gate, drain, and source terminal, the inverted signal of the first control signal being applied to the gate terminal of the second PMOS transistor, the second canceling capacitance being formed between the gate and drain terminals of the second PMOS transistor, wherein the drain terminals of the first and second PMOS transistors are connected together.

19. A phase-locked loop comprising:
a phase-frequency detector generating one or more control signals;
a charge pump coupled to the phase-frequency detector for receiving the one or more control signal, the charge pump comprising:
a first switching device configured for receiving a first control signal, the first switching device having at least a first parasitic capacitance such that a first transient current component is created across the first parasitic capacitance while the first control signal is in a transient state; and
a first canceling capacitance coupled to the first parasitic capacitance and configured for receiving an inverted signal of the first control signal such that a first canceling transient current component is created across the first canceling capacitance while the first control signal in a transient state, thereby effectively canceling out the first transient current component;
a loop filter coupled to the charge pump and configured for generating a voltage output Vc; and
a voltage-controlled oscillator coupled to the loop filter for receiving the voltage output Vc and configured for generating an output signal.

20. The phase-locked loop of claim 19, further comprising a frequency divider coupled to the voltage-controlled oscillator for receiving the output signal and coupled to the phase-frequency detector for providing a feedback signal to the phase-frequency detector.

* * * * *